(12) United States Patent
Akamatsu et al.

(10) Patent No.: US 11,290,103 B1
(45) Date of Patent: Mar. 29, 2022

(54) CHARGE TRANSFER BETWEEN GATE TERMINALS OF SUBTHRESHOLD CURRENT REDUCTION CIRCUIT TRANSISTORS AND RELATED APPARATUSES AND METHODS

(71) Applicant: Micron Technology, Inc., Boise, ID (US)

(72) Inventors: Hiroshi Akamatsu, Boise, ID (US); Yuan He, Boise, ID (US); Toru Ishikawa, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/953,457

(22) Filed: Nov. 20, 2020

(51) Int. Cl.
 *G06F 13/40* (2006.01)
 *H03K 17/16* (2006.01)
 *G11C 7/10* (2006.01)

(52) U.S. Cl.
 CPC ....... *H03K 17/161* (2013.01); *G06F 13/4077* (2013.01); *G11C 7/1048* (2013.01)

(58) Field of Classification Search
 CPC .............. H03K 17/161; H03K 17/16; H03K 17/04123; H03K 17/041; H03K 19/01; H03K 19/017; G06F 13/4077; G11C 7/1048
 See application file for complete search history.

(56) References Cited

U.S. PATENT DOCUMENTS 7,319,452 B2 * 1/2008 Moon .................. G11C 19/184
 345/100

* cited by examiner

*Primary Examiner* — Jung Kim
(74) *Attorney, Agent, or Firm* — TraskBritt

(57) ABSTRACT

Charge transfer between gate terminals of sub-threshold current reduction circuit (SCRC) transistors and related apparatuses and methods is disclosed. An apparatus includes a pull-up SCRC transistor, a pull-down SCRC transistor, and a charge transfer circuit. The pull-up SCRC transistor includes a pull-up gate terminal. The pull-down SCRC transistor includes a pull-down gate terminal. The charge transfer circuit is electrically connected between the pull-up gate terminal and the pull-down gate terminal. The charge transfer circuit is configured to transfer charge between the pull-up gate terminal and the pull-down gate terminal.

20 Claims, 5 Drawing Sheets

CHARGE TRANSFER BETWEEN GATE TERMINALS OF SUBTHRESHOLD CURRENT REDUCTION CIRCUIT TRANSISTORS AND RELATED APPARATUSES AND METHODS

TECHNICAL FIELD

This disclosure relates generally to charge transfer for sub-threshold current reduction (SCRC) circuitry, and more specifically to charge transfer between gate terminals of SCRC transistors and related SCRC pre-drive circuits, control circuitry, and signaling.

BACKGROUND

Sub-threshold current reduction circuit (SCRC) switches may be used to reduce sub-threshold leak current in electronic circuits. For example, even when logic circuitry is not activated, a small amount of current may be conducted therethrough. SCRC switches may be included between elements of electronic circuits and power supply lines to reduce the sub-threshold leak current by turning off the SCRC switches when the electronic circuits are not activated, and turning on the SCRC switches when the electronic circuits are activated.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
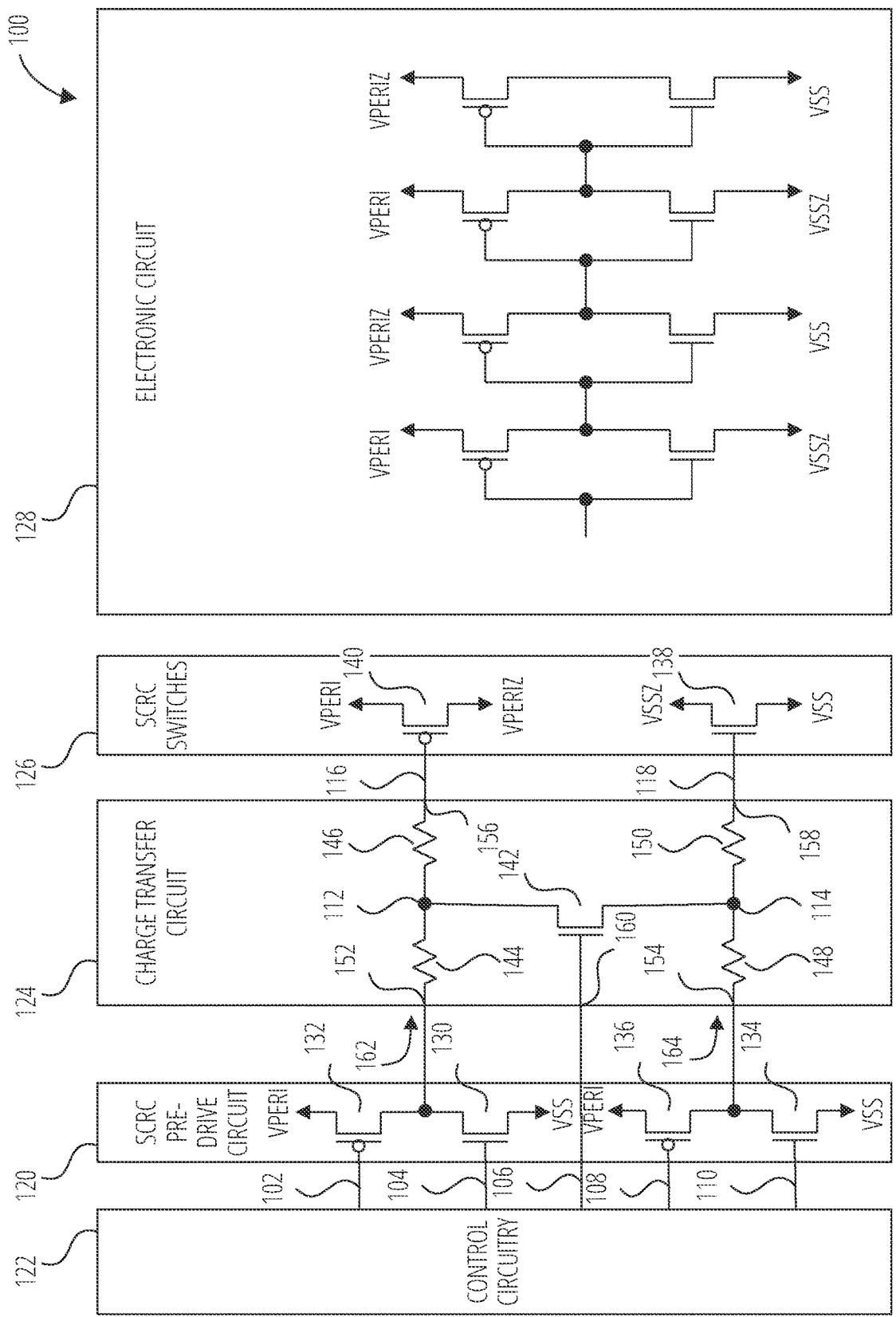
FIG. 1 is a circuit schematic illustration of an apparatus, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, the term "electrically connected" refers to both direct (i.e., no intervening electrical elements electrically connected in between) and indirect (i.e., one or more intervening elements electrically connected in between) electrical connections.

As used herein, the terms "active material" or "diffusion material" refer to a semiconductor material that has been doped to function as a channel material in a metal oxide semiconductor (MOS) field effect transistor (FET) (MOSFET). A MOSFET transistor having a channel material that has been doped predominantly with donor impurities is referred to herein as an N-type MOS (NMOS) transistor because the active material serving as the channel material for the NMOS transistor includes N-type semiconductor material. Similarly, a MOSFET transistor having a channel material that has been doped predominantly with trivalent or acceptor impurities is referred to herein as a P-type MOS (PMOS) transistor because the active material serving as the channel material for the PMOS transistor includes P-type semiconductor material.

As use herein, the term "assert," when used with reference to an assertion of a voltage potential or other electrical signal on a gate terminal of a transistor or to control a switch, refers to an application of an appropriate voltage potential or other signal to "turn on" the transistor or switch. For example, a transistor may be "turned on" when the transistor operates in a saturation state wherein a source terminal and a drain terminal of the transistor are electrically connected to each other through the transistor. As another example, a switch in general may be "turned on" when the switch is closed. By extension, the term "de-assert," when used with reference to a de-assertion of a voltage potential or other electrical signal on the gate terminal of the transistor, refers to an application of an appropriate voltage potential to "turn off" the transistor, or in other words cause the transistor to operate in a cutoff state wherein the source terminal and the drain terminal of the transistor are electrically isolated from each other through the transistor.

SCRC switches may be used in various electronic circuits to reduce leakage current. Transistors used for SCRC switches may be designed to have relatively higher threshold voltage potential magnitudes than those of other transistors of an electronic circuit. Higher threshold voltage potential magnitudes in transistors is associated with lower leakage current than that of lower threshold voltage potential magnitudes in transistors. As a result, the leakage current through the other transistors of the electronic circuit, which may have relatively lower threshold voltage potential magnitudes, may be limited by a relatively low leakage current through the SCRC switch transistors, which may have relatively higher threshold voltage potential magnitudes.

SCRC switch transistors may be relatively large as compared to sizes of transistors used in logic circuitry to avoid delay penalties associated with relatively high electrical resistances of relatively smaller transistors. As used herein, terms relating to a size of a transistor such as "size," "large," "small," and other related terms refer to a width of a gate terminal of the transistor. A delay time may be a function of the sizes of the transistors used as SCRC switches. More specifically, the delay time may decrease as a function of increase in a ratio between a width of the SCRC switches and a width of logic transistors used in the electronic circuit.

A value of this ratio between SCRC switch transistor width and logic transistor width of between three and five may provide a generally acceptable balance between the delay time and SCRC switch transistor size. When applied to random operation control logic blocks, however, it may be relatively difficult to estimate how many transistors will operate at the same time in a random operation control logic block. SCRC switch transistor size for random operating control logic blocks may be designed based on SCRC switch transistor sizes of other known devices as a rule of thumb. Although this approach may mitigate a speed penalty associated with SCRC switch transistor that are too small, this approach may result in oversized SCRC switch transistors.

Oversized SCRC switch transistors may result in a relatively large switching current when turning on and turning off SCRC switch transistors. When SCRC switch transistors turn on and off, gate terminals of both PMOS and NMOS SCRC switch transistors may be charged and discharged, respectively. A power supply current may increase to supply a switching current to enable this charging and discharging of the gate terminals during switching of the SCRC switch transistors. This switching current may be proportional to the sizes (e.g., the width) of the gate terminals of the SCRC switch transistors. For example, a relatively large width of the gate terminals of the SCRC switch transistors may result in a relatively large switching current, and relatively smaller gate terminal sizes may result in relatively smaller switching currents. If switching (e.g., turning on and turning off) of the SCRC switch transistors occurs frequently, a relatively large amount of power may be expended to supply the switching current.

Another issue resulting from oversized SCRC switch transistors is that leakage currents of the SCRC switch transistors may be proportional to the sizes (e.g., the widths of the gate terminals) of the SCRC switch transistors. Although the SCRC switch transistors may be designed with relatively large threshold voltage potential magnitudes to reduce leakage current, excessive SCRC switch transistor sizes may undermine some of the reduction of the leakage current.

A further issue resulting from oversized SCRC switch transistors is that chip area, sometimes referred to in the art as "real estate," is valuable. To the extent that SCRC switch transistors are larger than necessary (e.g., oversized) for their intended operations, the extra real estate consumed due to the excessive size of the SCRC switch transistors may reduce the amount of chip area that is available for other circuitry or may limit how small the chip may be, which undermines the general design goal to create smaller and smaller devices.

Embodiments disclosed herein relate to charge transfer between gate terminals of pull-up SCRC transistors and gate terminals of pull-down SCRC transistors. Charge transfer between a gate terminal of a pull-up SCRC transistor and a gate terminal of a pull-down SCRC transistor may reduce the amount of current drawn from power supply terminals in order to switch the pull-up SCRC transistor and the pull-down SCRC transistor. In other words, otherwise unused charge at the gate terminal of the pull-up SCRC transistor may be used to assist in switching the pull-down SCRC transistor, and otherwise unused charge at the gate terminal of the pull-down SCRC transistor may be used to assist in switching the pull-up SCRC transistor, reducing the amount of charge that would otherwise be drawn from the power supply lines. As a result, power supply current drawn for switching the SCRC transistors may be reduced. Results from simulations suggest that substantially twenty percent (20%) reduction in the power supply current due to SCRC transistor switching may be obtained using charge transfer embodiments disclosed herein.

In some embodiments an apparatus includes a pull-up SCRC transistor, a pull-down SCRC transistor, and a charge transfer circuit. The pull-up SCRC transistor includes a pull-up gate terminal. The pull-down SCRC transistor includes a pull-down gate terminal. The charge transfer circuit is electrically connected between the pull-up gate terminal and the pull-down gate terminal. The charge transfer circuit is configured to transfer charge between the pull-up gate terminal and the pull-down gate terminal.

In some embodiments an apparatus includes a first input terminal, a second input terminal, a first output terminal, and a second output terminal. The first output terminal is electrically connected to a pull-up gate terminal of at least one pull-up SCRC transistor, the second output terminal electrically connected to a pull-down gate terminal of at least one pull-down SCRC transistor. The apparatus also includes a first resistive path between the first input terminal and the first output terminal, a second resistive path between the second input terminal and the second output terminal, and a charge transfer gate electrically connected between the first resistive path and the second resistive path.

In some embodiments a method of switching SCRC switches includes operating an SCRC pre-drive circuit in an SCRC off operational state, operating the SCRC pre-drive circuit in an SCRC on operational state; maintaining the SCRC pre-drive circuit deactivated during a charge transfer period of time at transitions between the SCRC off operational state and the SCRC on operational state, and transferring charge between pull-up gate terminals of one or more pull-up SCRC transistors and pull-down gate terminals of one or more pull-down SCRC transistors during the charge transfer period of time.

FIG. 1 is a circuit schematic illustration of an apparatus 100, according to some embodiments. The apparatus 100 includes control circuitry 122, SCRC pre-drive circuit 120, charge transfer circuit 124, SCRC switches 126, and electronic circuit 128. By way of non-limiting example, the electronic circuit 128 may include circuitry for a memory device. The SCRC switches 126 are configured to selectively electrically connect power reception lines (e.g., VPERIZ and VSSZ in FIG. 1) to power supply lines (e.g., VPERI and VSS in FIG. 2). For example, when the electronic circuit 128 is active the SCRC switches 126 may provide power to the electronic circuit 128. When the electronic circuit 128 is inactive, the SCRC switches 126 are configured to electrically isolate the power reception lines VPERIZ, VSSZ from the power supply lines VPERI, VSS to reduce leakage current drawn by the electronic circuit 128 from the power supply lines VPERI, VSS.

The SCRC switches 126 include one or more pull-up SCRC transistors 140 electrically connected between a power supply high voltage potential line VPERI and a power reception high voltage potential line VPERIZ. The SCRC switches 126 also include one or more pull-down SCRC transistors 138 electrically connected between a power supply low voltage potential line VSS and a power reception low voltage potential line VSSZ. Accordingly, responsive to assertions of signals at pull-up SCRC gate terminals 116 of the one or more pull-up SCRC transistors 140 and pull-down SCRC gate terminals 118 of the one or more pull-down SCRC transistors 138 the SCRC switches 126 may electrically connect the power reception lines VPERIZ, VSSZ to the power supply lines VPERI, VSS.

The charge transfer circuit 124 is electrically connected between the pull-up SCRC gate terminals 116 and the pull-down SCRC gate terminals 118. The charge transfer circuit 124 is configured to transfer charge between the pull-up SCRC gate terminals 116 and the pull-down SCRC gate terminals 118. The charge transfer circuit 124 includes a charge transfer gate 142 that is electrically controllable to selectively transfer the charge between the pull-up SCRC gate terminals 116 and the pull-down SCRC gate terminals 118. By way of non-limiting example, the charge transfer gate 142 may include a MOSFET transistor.

The charge transfer circuit 124 also includes a first input terminal 152, a second input terminal 154, a third input terminal 160, a first output terminal 156, a second output terminal 158, a first intermediate node 112, a second intermediate node 114, a first resistor 146, a second resistor 150, a third resistor 144, and a fourth resistor 148. The first output terminal 156 is electrically connected to the pull-up SCRC gate terminals 116. The second output terminal 158 is electrically connected to the pull-down SCRC gate terminals 118. The first resistor 146 is electrically connected between the first intermediate node 112 and the first output terminal 156. The second resistor 150 is electrically connected between the second intermediate node 114 and the second output terminal 158. The third resistor 144 is electrically connected between the first input terminal 152 and the first intermediate node 112. The fourth resistor 148 is electrically connected between the second input terminal 154 and the second intermediate node 114.

The charge transfer gate 142 is electrically connected between the first intermediate node 112 and the second intermediate node 114. A gate terminal of the charge transfer gate 142 is electrically connected to the third input terminal 160. The third input terminal 160 is electrically connected to the control circuitry 122 via a charge transfer gate terminal 106. The control circuitry 122 may be configured to control the charge transfer gate 142, and by extension the charge transfer circuit 124, via the charge transfer gate terminal 106.

The charge transfer circuit 124 includes a first resistive path 162 between the first input terminal 152 and the first output terminal 156. The charge transfer circuit 124 also includes a second resistive path 164 between the second input terminal 154 and the second output terminal 158. The charge transfer gate 142 selectively electrically connects the first resistive path 162 to the second resistive path 164.

The SCRC pre-drive circuit 120 is electrically connected to the first input terminal 152 and the second input terminal 154 of the charge transfer circuit 124. The SCRC pre-drive circuit 120 is configured to provide a pull-up SCRC control signal to the first input terminal 152 and a pull-down SCRC control signal to the second input terminal 154 to control switching of the SCRC switches 126.

The SCRC pre-drive circuit 120 includes a first pull-up transistor 132 and a first pull-down transistor 130 configured to receive a first pair of SCRC control signals, via first pull-up gate terminal 102 and first pull-down gate terminal 104, from the control circuitry 122. The first pull-up transistor 132 is electrically connected in series with the first pull-down transistor 130 between a power supply high voltage potential line VPERI and a power supply low voltage potential line VSS. The first input terminal 152 of the charge transfer circuit 124 is electrically connected to a node between the first pull-up transistor 132 and the first pull-down transistor 130.

The SCRC pre-drive circuit 120 also includes a second pull-up transistor 136 and a second pull-down transistor 134 configured to receive a second pair of SCRC control signals, via second pull-up gate terminal 108 and second pull-down gate terminal 110, from the control circuitry 122. The second pull-up transistor 136 is electrically connected in series with the second pull-down transistor 134 between a power supply high voltage potential line VPERI and a power supply low voltage potential line VSS. The second input terminal 154 of the charge transfer circuit 124 is electrically connected to a node between the second pull-up transistor 136 and the first pull-down transistor 130.

The control circuitry 122 is electrically connected to the SCRC pre-drive circuit 120 and the charge transfer circuit 124. Specifically, the control circuitry 122 is electrically connected to the first pull-up gate terminal 102 of the first pull-up transistor 132, the first pull-down gate terminal 104 of the first pull-down transistor 130, the charge transfer gate terminal 106 of charge transfer gate 142 (e.g., via the third input terminal 160 of the charge transfer circuit 124), the second pull-up gate terminal 108 of the second pull-up transistor 136, and the second pull-down gate terminal 110 of the second pull-down transistor 134. The control circuitry 122 is configured to provide signals to the first pull-up gate terminal 102, the first pull-down gate terminal 104, the charge transfer gate terminal 106, the second pull-up gate terminal 108, and the second pull-down gate terminal 110 to control operation of the SCRC pre-drive circuit 120, the charge transfer circuit 124, and the SCRC switches 126. Examples of signals that the control circuitry 122 is configured to provide are discussed with reference to FIG. 2.

Figure 2:
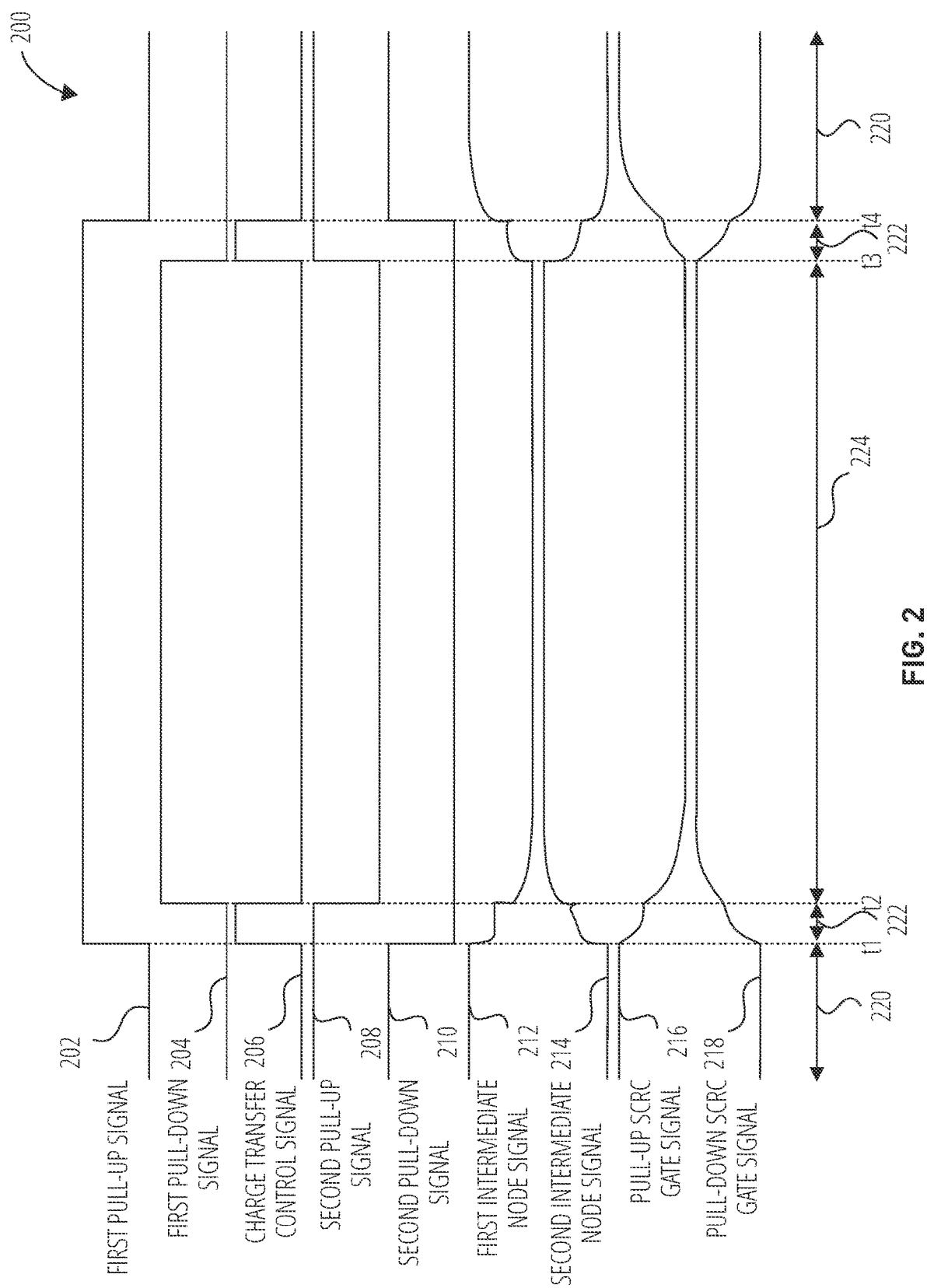
FIG. 2 is a signal timing diagram of signals of the apparatus of FIG. 1, according to some embodiments.

FIG. 2 is a signal timing diagram of signals 200 of the apparatus 100 of FIG. 1, according to some embodiments. Referring to FIG. 1 and FIG. 2 together, the signals 200 include a first pull-up signal 202 (on the first pull-up gate terminal 102), a first pull-down signal 204 (on the first pull-down gate terminal 104), a charge transfer control signal 206 (on the charge transfer gate terminal 106), a second pull-up signal 208 (on the second pull-up gate terminal 108), a second pull-down signal 210 (second pull-down gate terminal 110), a first intermediate node signal 212 (on the first intermediate node 112), a second intermediate node signal 214 (on the second intermediate node 114), a pull-up SCRC gate signal 216 (on the pull-up SCRC gate terminals 116), and a pull-down SCRC gate signal 218 (on the pull-down SCRC gate signal 218).

The control circuitry 122 is configured to provide the first pull-up signal 202 to the first pull-up gate terminal 102 of the first pull-up transistor 132. Responsive to an assertion (e.g., a logic level low voltage potential as the first pull-up transistor 132 is a PMOS transistor) of the first pull-up signal 202, the first pull-up transistor 132 may electrically connect the power supply high voltage potential line VPERI to the first input terminal 152 of the charge transfer circuit 124. Responsive to a de-assertion (e.g., a logic level high voltage potential) of the first pull-up signal 202, the first pull-up transistor 132 may electrically isolate the power supply high voltage potential line VPERI from the first input terminal 152.

The control circuitry 122 is also configured to provide the first pull-down signal 204 to the first pull-down gate terminal 104 of the first pull-down transistor 130. Responsive to an assertion (e.g., a logic level high voltage potential as the first pull-down transistor 130 is an NMOS transistor) of the first pull-down signal 204, the first pull-down transistor 130 may electrically connect the power supply low voltage potential line VSS to the first input terminal 152 of the charge transfer circuit 124. Responsive to a de-assertion (e.g., a logic level low voltage potential as the first pull-down transistor 130 is an NMOS transistor) of the first pull-down signal 204, the first pull-down transistor 130 may electrically isolate the power supply low voltage potential line VSS from the first input terminal 152.

The control circuitry 122 is further configured to provide the charge transfer control signal 206 to the charge transfer gate terminal 106 of the charge transfer gate 142 (e.g., via the third input terminal 160 of the charge transfer circuit 124). Responsive to an assertion (e.g., a logic level high voltage potential as the charge transfer gate 142 is an NMOS transistor) of the charge transfer control signal 206, the charge transfer gate 142 may electrically connect the first intermediate node 112 to the second intermediate node 114. As a result, the charge transfer gate 142 may electrically connect the first resistive path 162 to the second resistive path 164. Responsive to a de-assertion (e.g., a logic level low voltage potential as the charge transfer gate 142 is an NMOS transistor) of the charge transfer control signal 206, the charge transfer gate 142 may electrically isolate the first intermediate node 112 from the second intermediate node 114. As a result, the charge transfer gate 142 may electrically isolate the first resistive path 162 from the second resistive path 164.

The control circuitry 122 is further configured to provide the second pull-up signal 208 to the second pull-up gate terminal 108 of the second pull-up transistor 136. Responsive to an assertion (e.g., a logic level low voltage potential as the second pull-up transistor 136 is a PMOS transistor) of the second pull-up signal 208, the second pull-up transistor 136 may electrically connect the power supply high voltage potential line VPERI to the second input terminal 154 of the charge transfer circuit 124. Responsive to a de-assertion (e.g., a logic level high voltage potential as the second pull-up transistor 136 is a PMOS transistor) of the second pull-up signal 208 the second pull-up transistor 136 may electrically isolate the power supply high voltage potential line VPERI from the second input terminal 154 of the charge transfer circuit 124.

The control circuitry 122 is also configured to provide the second pull-down signal 210 to the second pull-down gate terminal 110 of the second pull-down transistor 134. Responsive to an assertion (e.g., a logic level high voltage potential as the second pull-down transistor 134 is an NMOS transistor), the second pull-down transistor 134 may electrically connect the power supply low voltage potential line VSS to the second input terminal 154 of the charge transfer circuit 124. Responsive to a de-assertion (e.g., a logic level low voltage potential as the second pull-down transistor 134 is an NMOS transistor), the second pull-down transistor 134 may electrically isolate the power supply low voltage potential line VSS from the second input terminal 154 of the charge transfer circuit 124.

In an SCRC off operational state 220 during which the SCRC switches 126 are turned off to prevent provision of power to the electronic circuit 128, the control circuitry 122 may maintain asserted the first pull-up signal 202 and the second pull-down signal 210 and maintain de-asserted the first pull-down signal 204 and the second pull-up signal 208. As a result, the first input terminal 152 of the charge transfer circuit 124 may be electrically connected to the power supply high voltage potential line VPERI through the first pull-up transistor 132 and the second input terminal 154 may be electrically connected to the power supply low voltage potential line VSS through the second pull-down transistor 134.

With the first input terminal 152 electrically connected, in the SCRC off operational state 220, to the power supply high voltage potential line VPERI the first intermediate node 112 and the pull-up SCRC gate terminals 116 may charge toward a logic level high voltage potential. FIG. 2 shows the first intermediate node signal 212 and the pull-up SCRC gate signal 216 on the first intermediate node 112 and the pull-up SCRC gate terminals 116, respectively, charging to and maintaining at the logic level high voltage potential during the SCRC off operational state 220. The logic level high voltage potential of the pull-up SCRC gate signal 216 may serve as a de-assertion of the pull-up SCRC gate terminals 116 of the one or more pull-up SCRC transistors 140, electrically isolating the power supply high voltage potential line VPERI from the power reception high voltage potential line VPERIZ.

Also, with the second input terminal 154 electrically connected, in the SCRC off operational state 220, to the power supply low voltage potential line VSS the second intermediate node 114 and the pull-down SCRC gate terminals 118 may charge toward a logic level low voltage potential. FIG. 2 shows the second intermediate node signal 214 and the pull-down SCRC gate signal 218 on the first intermediate node 112 and the pull-up SCRC gate terminals 116, respectively, charging to and maintaining at the logic level low voltage potential during the SCRC off operational state 220. The logic level low voltage potential of the pull-down SCRC gate signal 218 may serve as a de-assertion of the pull-down SCRC gate terminals 118 of the one or more pull-down SCRC transistors 138, electrically isolating the power supply low voltage potential line VSS from the power reception low voltage potential line VSSZ.

In an SCRC on operational state 224 during which the SCRC switches 126 are turned on to provide power to the electronic circuit 128, the control circuitry 122 may maintain de-asserted the first pull-up signal 202 and the second pull-down signal 210 and maintain asserted the first pull-down signal 204 and the second pull-up signal 208. As a result, the first input terminal 152 of the charge transfer circuit 124 may be electrically connected to the power supply low voltage potential line VSS through the first pull-down transistor 130 and the second input terminal 154 may be electrically connected to the power supply high voltage potential line VPERI through the second pull-up transistor 136.

With the first input terminal 152 electrically connected, in the SCRC on operational state 224, to the power supply low voltage potential line VSS the first intermediate node 112 and the pull-up SCRC gate terminals 116 may charge toward a logic level low voltage potential. FIG. 2 shows the first intermediate node signal 212 and the pull-up SCRC gate signal 216 on the first intermediate node 112 and the pull-up SCRC gate terminals 116, respectively, charging to and maintaining at the logic level low voltage potential during the SCRC on operational state 224. The logic level low voltage potential of the pull-up SCRC gate signal 216 may serve as an assertion of the pull-up SCRC gate terminals 116 of the one or more pull-up SCRC transistors 140, electrically connecting the power supply high voltage potential line VPERI to the power reception high voltage potential line VPERIZ.

Also, with the second input terminal 154 electrically connected, in the SCRC on operational state 224, to the power supply high voltage potential line VPERI the second intermediate node 114 and the pull-down SCRC gate terminals 118 may charge toward a logic level high voltage potential. FIG. 2 shows the second intermediate node signal 214 and the pull-down SCRC gate signal 218 on the first intermediate node 112 and the pull-up SCRC gate terminals 116, respectively, charging to and maintaining at the logic level high voltage potential during the SCRC on operational state 224. The logic level high voltage potential of the pull-down SCRC gate signal 218 may serve as an assertion of the pull-down SCRC gate terminals 118 of the one or more pull-down SCRC transistors 138, electrically connecting the power supply low voltage potential line VSS to the power reception low voltage potential line VSSZ.

In transitions between the SCRC off operational state 220 and the SCRC on operational state 224 the control circuitry 122 may control the apparatus 100 in a charge transfer period of time 222. In the charge transfer period of time 222 the control circuitry 122 may de-assert each of the first pull-up signal 202, the first pull-down signal 204, the second pull-up signal 208, and the second pull-down signal 210, and assert the charge transfer control signal 206. As a result, the first input terminal 152 and the second input terminal 154 may be electrically isolated from the power supply lines VPERI, VSS by the SCRC pre-drive circuit 120. In other words, the control circuitry 122 may deactivate, or turn off, the SCRC pre-drive circuit 120 during the charge transfer period of time 222. The assertion of the charge transfer control signal 206, however, may electrically connect the first intermediate node 112 to the second intermediate node 114 through the charge transfer gate 142, and charge at the pull-up SCRC gate terminals 116 and the pull-down SCRC gate terminals 118 may be transferred (e.g., equalized) through the charge transfer gate 142. Accordingly, the first intermediate node signal 212, the second intermediate node signal 214, the pull-up SCRC gate signal 216, and the pull-down SCRC gate signal 218 may each discharge during the charge transfer period of time 222.

By way of non-limiting example, in a transition from the SCRC off operational state 220 to the SCRC on operational state 224 (the charge transfer period of time 222 starting at time t1 and ending at time t2) the first intermediate node signal 212 and the pull-up SCRC gate signal 216 may discharge from a logic level high voltage potential toward the logic level low voltage potential. Consequently, at the end of the charge transfer period of time 222 the first intermediate node signal 212 and the pull-up SCRC gate signal 216 are closer to the logic level low voltage potential than at the end of the SCRC off operational state 220. With the first intermediate node signal 212 and the second intermediate node signal 214 thus reduced, less current is required to pull the first intermediate node signal 212 and the pull-up SCRC gate signal 216 down to the logic level low voltage potential in the SCRC on operational state 224 than if a transition was made directly from the SCRC off operational state 220 to the SCRC on operational state 224 without the charge transfer period of time 222. Similarly, during the charge transfer period of time 222 the second intermediate node signal 214 and the pull-down SCRC gate signal 218 may discharge toward the logic level high voltage potential. With the second intermediate node signal 214 and the pull-down SCRC gate signal 218 thus increased, less current is required to pull the second intermediate node signal 214 and the pull-down SCRC gate signal 218 up to the logic level high voltage potential in the SCRC on operational state 224 than if a transition was made directly from the SCRC off operational state 220 to the SCRC on operational state 224 without the charge transfer period of time 222.

Also by way of non-limiting example, in a transition from the SCRC on operational state 224 to the SCRC off operational state 220 (the charge transfer period of time 222 starting at time t3 and ending at time t4) the first intermediate node signal 212 and the pull-up SCRC gate signal 216 may discharge from a logic level low voltage potential toward the logic level high voltage potential. Consequently, at the end of the charge transfer period of time 222 the first intermediate node signal 212 and the pull-up SCRC gate signal 216 are closer to the logic level high voltage potential than at the end of the SCRC on operational state 224. With the first intermediate node signal 212 and the second intermediate node signal 214 thus increased, less current is required to pull the first intermediate node signal 212 and the pull-up SCRC gate signal 216 up to the logic level high voltage potential in the SCRC off operational state 220 than if a transition was made directly from the SCRC on operational state 224 to the SCRC off operational state 220 without the charge transfer period of time 222. Similarly, during the charge transfer period of time 222 the second intermediate node signal 214 and the pull-down SCRC gate signal 218 may discharge toward the logic level low voltage potential. With the second intermediate node signal 214 and the pull-down SCRC gate signal 218 thus decreased, less current is required to pull the second intermediate node signal 214 and the pull-down SCRC gate signal 218 down to the logic level low voltage potential in the SCRC off operational state 220 than if a transition was made directly from the SCRC on operational state 224 to the SCRC off operational state 220 without the charge transfer period of time 222.

A first pair of SCRC control signals may include the first pull-up signal 202 and the first pull-down signal 204. As illustrated in FIG. 2 the control circuitry 122 may be configured to stagger in time assertions and de-assertions of the first pull-up signal 202 with assertions and de-assertions, respectively, of the first pull-down signal 204. The control circuitry 122 is configured to assert the charge transfer control signal 206 between the staggered assertions and de-assertions of the first pull-up signal 202 and the first pull-down signal 204.

Similarly, a second pair of SCRC control signals includes the second pull-up signal 208 and the second pull-down signal 210. As illustrated in FIG. 2 the control circuitry 122 may be configured to stagger in time assertions and de-assertions of the second pull-up signal 208 with assertions and de-assertions, respectively, of the second pull-down signal 210. The control circuitry 122 is configured to assert the charge transfer control signal 206 between the staggered assertions and de-assertions of the second pull-up signal 208 and the second pull-down signal 210.

Figure 3:
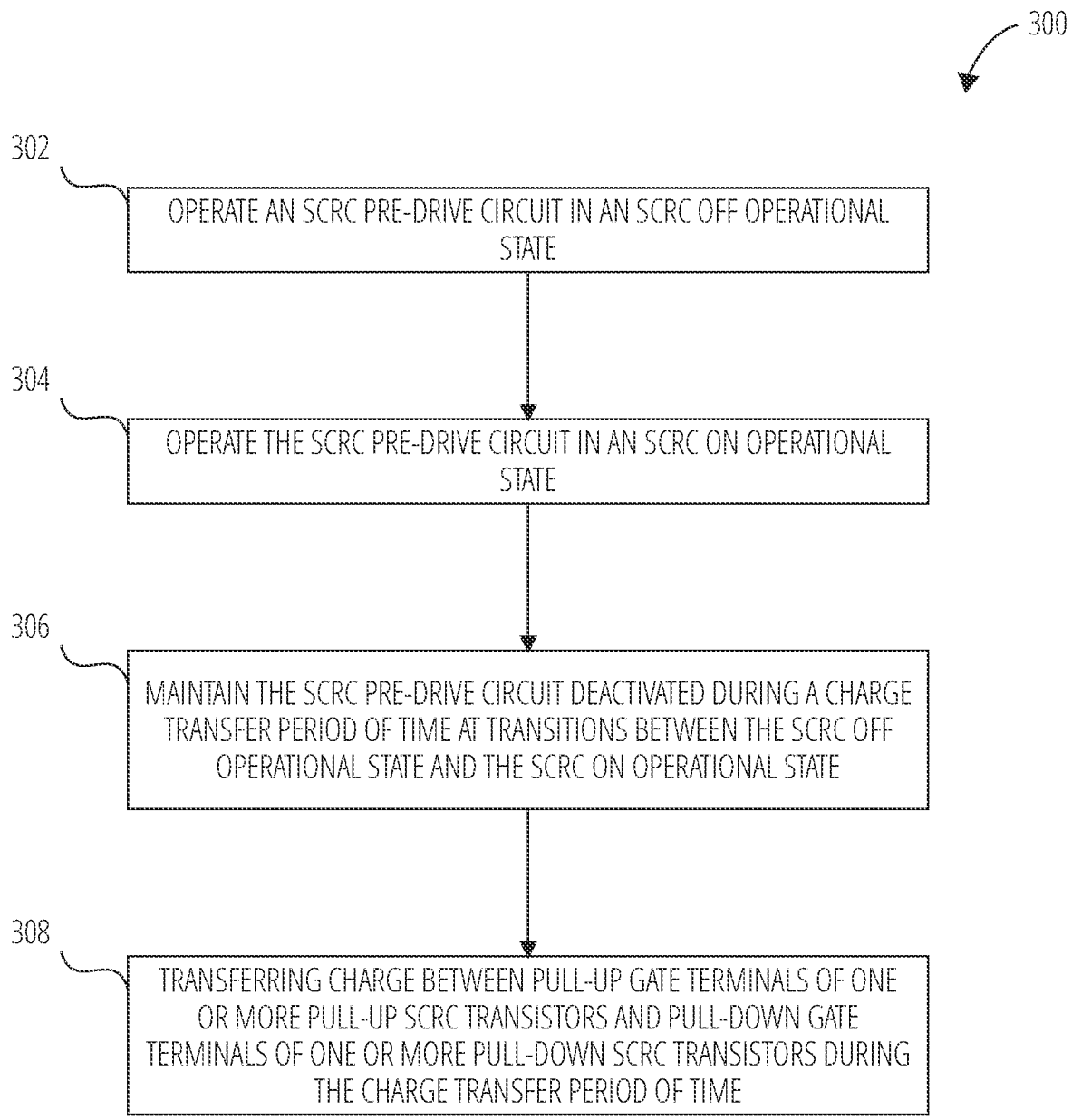
FIG. 3 is a flowchart illustrating a method of switching SCRC switches, according to some embodiments.

FIG. 3 is a flowchart illustrating a method 300 of switching SCRC switches, according to some embodiments. In some embodiments the method 300 may be performed by the control circuitry 122 of FIG. 1. In operation 302 the method 300 includes operating an SCRC pre-drive circuit (e.g., the SCRC pre-drive circuit 120 of FIG. 1) in an SCRC off operational state (e.g., the SCRC off operational state 220). In some embodiments operating the SCRC pre-drive circuit in the SCRC off operational state includes maintaining asserted a first pull-up signal (e.g., the first pull-up signal 202 of FIG. 2) on a gate terminal (e.g., the first pull-up gate terminal 102 of FIG. 1) of a first pull-up transistor (e.g., the first pull-up transistor 132 of FIG. 1) of the SCRC pre-drive circuit. Operating the SCRC pre-drive circuit in the SCRC off operational state may also include maintaining de-asserted a first pull-down signal (e.g., first pull-down signal 204 of FIG. 2) on a gate terminal (e.g., first pull-down gate terminal 104 of FIG. 1) of a first pull-down transistor (e.g., first pull-up transistor 132 of FIG. 1) of the SCRC pre-drive circuit. Operating the SCRC pre-drive circuit in the SCRC off operational state may further include maintaining de-asserted a second pull-up signal (e.g., second pull-up signal 208 of FIG. 2) on a gate terminal (e.g., second pull-up gate terminal 108 of FIG. 1) of a second pull-up transistor (e.g., second pull-up transistor 136 of FIG. 1) of the SCRC pre-drive circuit. Operating the SCRC pre-drive circuit in the SCRC off operational state may also include maintaining asserted a second pull-down signal (e.g., second pull-down signal 210 of FIG. 2) on a gate terminal (e.g., second pull-down gate terminal 110 of FIG. 1) of a second pull-down transistor (e.g., second pull-down transistor 134 of FIG. 1) of the SCRC pre-drive circuit.

In operation 304 the method 300 includes operating the SCRC pre-drive circuit in an SCRC on operational state (e.g., SCRC on operational state 224 of FIG. 2). In some embodiments operating the SCRC pre-drive circuit in the SCRC on operational state includes maintaining de-asserted the first pull-up signal on the gate terminal of a first pull-up transistor of the SCRC pre-drive circuit. Operating the SCRC pre-drive circuit in the SCRC on operational state may also include maintaining asserted the first pull-down signal on the gate terminal of the first pull-down transistor of the SCRC pre-drive circuit. Operating the SCRC pre-drive circuit in the SCRC on operational state may further include maintaining asserted the second pull-up signal on the gate terminal of the second pull-up transistor of the SCRC pre-drive circuit. Operating the SCRC pre-drive circuit in the SCRC on operational state may also include maintaining de-asserted the second pull-down signal on the gate terminal of the second pull-down transistor of the SCRC pre-drive circuit.

In operation 306 the method 300 includes maintaining the SCRC pre-drive circuit deactivated during a charge transfer period of time (e.g., charge transfer period of time 222 of FIG. 2) at transitions between the SCRC off operational state and the SCRC on operational state. In some embodiments maintaining the SCRC pre-drive circuit deactivated includes maintaining de-asserted the first pull-up signal on the gate terminal of the first pull-up transistor of the SCRC pre-drive circuit. Maintaining the SCRC pre-drive circuit deactivated may also include maintaining de-asserted the first pull-down signal on the gate terminal of the first pull-down transistor of the SCRC pre-drive circuit. Maintaining the SCRC pre-drive circuit deactivated may further include maintaining de-asserted the second pull-up signal on the gate terminal of the second pull-up transistor of the SCRC pre-drive circuit. Maintaining the SCRC pre-drive circuit deactivated may also include maintaining de-asserted the second pull-down signal on the gate terminal of the second pull-down transistor of the SCRC pre-drive circuit.

In operation 308 the method 300 includes transferring charge between pull-up gate terminals (e.g., pull-up SCRC gate terminals 116 of FIG. 1) of one or more pull-up SCRC transistors (e.g., one or more pull-up SCRC transistors 140 of FIG. 1) and pull-down gate terminals (e.g., pull-down SCRC gate terminals 118 of FIG. 1) of one or more pull-down SCRC transistors (e.g., one or more pull-down SCRC transistors 138 of FIG. 1) during the charge transfer period of time. In some embodiments transferring charge between the pull-up gate terminals of one or more pull-up SCRC transistors and pull-down gate terminals of one or more pull-down SCRC transistors includes asserting a charge transfer control signal (e.g., charge transfer control signal 206 of FIG. 2) on a gate terminal (e.g., charge transfer gate terminal 106 of FIG. 1) of a charge transfer gate (e.g., charge transfer gate 142 of FIG. 1).

Figure 4:
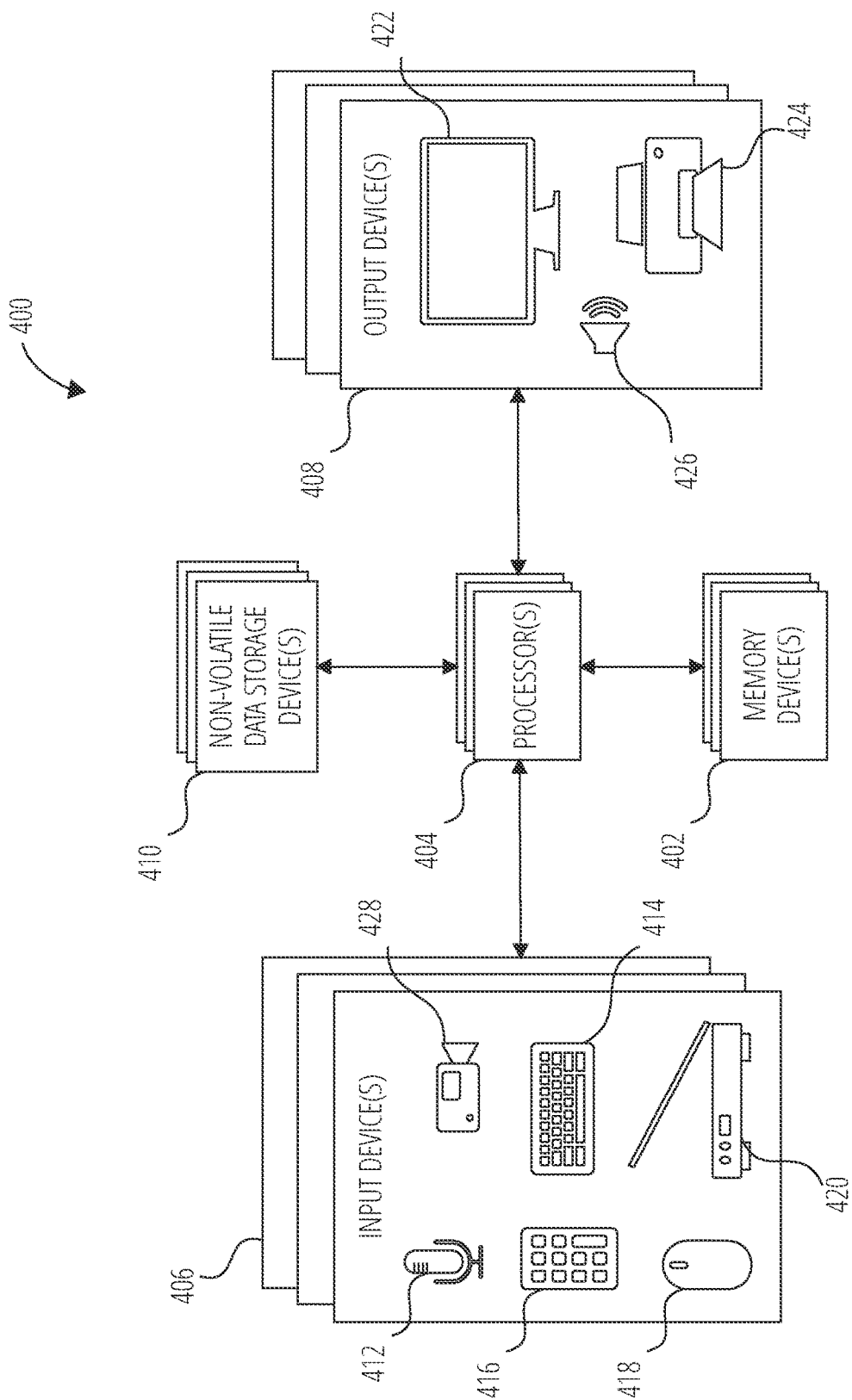
FIG. 4 is a block diagram of a computing system, according to some embodiments.

FIG. 4 is a block diagram of a computing system 400, according to some embodiments. The computing system 400 includes one or more processors 404 operably coupled to one or more memory devices 402, one or more non-volatile data storage devices 410, one or more input devices 406, and one or more output devices 408. In some embodiments the computing system 400 includes a personal computer (PC) such as a desktop computer, a laptop computer, a tablet computer, a mobile computer (e.g., a smartphone, a personal digital assistant (PDA), etc.), a network server, or other computer device.

In some embodiments the one or more processors 404 may include a central processing unit (CPU) or other processor configured to control the computing system 400. In some embodiments the one or more memory devices 402 include random access memory (RAM), such as volatile data storage (e.g., dynamic RAM (DRAM) static RAM (SRAM), etc.). In some embodiments the one or more non-volatile data storage devices 410 include a hard drive, a solid state drive, Flash memory, erasable programmable read only memory (EPROM), other non-volatile data storage devices, or any combination thereof. In some embodiments the one or more input devices 406 include a keyboard 414, a pointing device 418 (e.g., a mouse, a track pad, etc.), a microphone 412, a keypad 416, a scanner 420, a camera 428, other input devices, or any combination thereof. In some embodiments the output devices 408 include an electronic display 422, a speaker 426, a printer 424, other output devices, or any combination thereof.

In some embodiments the one or more memory devices 402 may include the apparatus 100 of FIG. 1. By way of non-limiting example, the electronic circuit 128 of FIG. 1 may include circuitry for a memory device. Also by way of non-limiting example, the one or more memory devices 402 may be configured to perform the method 300 of FIG. 3. As a further non-limiting example, the one or more memory devices 402 may be configured to operate according to the signal timing diagram of FIG. 2.

Figure 5:
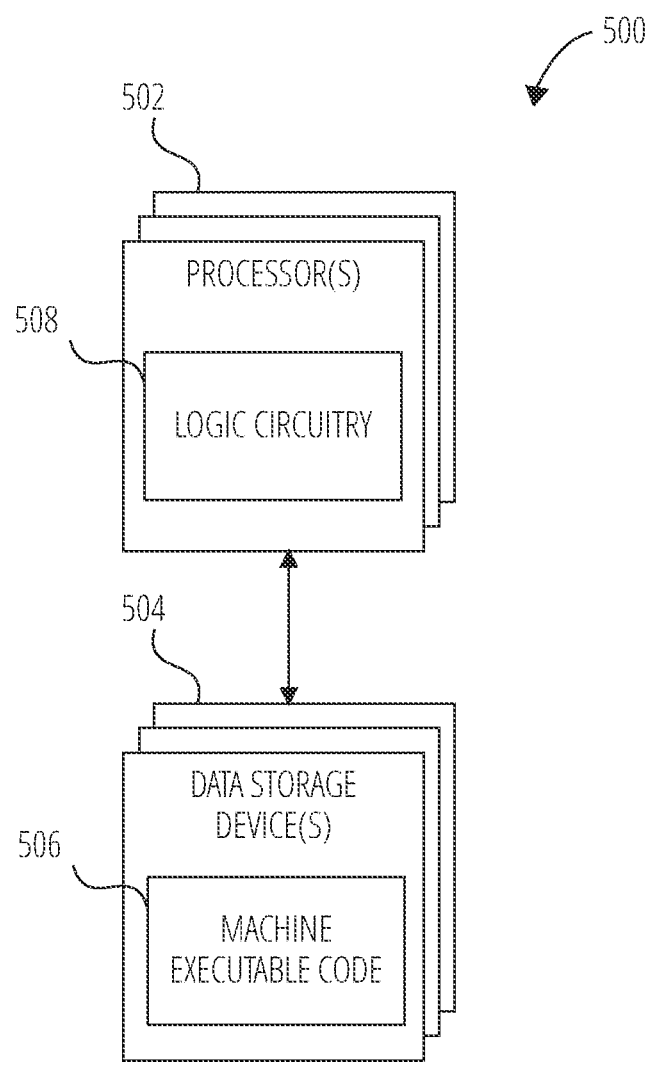
FIG. 5 is a block diagram of circuitry that, in some embodiments, may be used to implement various functions, operations, acts, processes, and/or methods disclosed herein.

It will be appreciated by those of ordinary skill in the art that functional elements of embodiments disclosed herein (e.g., functions, operations, acts, processes, and/or methods) may be implemented in any suitable hardware, software, firmware, or combinations thereof. FIG. 5 illustrates non-limiting examples of implementations of functional elements disclosed herein. In some embodiments, some or all portions of the functional elements disclosed herein may be performed by hardware specially configured for carrying out the functional elements.

FIG. 5 is a block diagram of circuitry 500 that, in some embodiments, may be used to implement various functions, operations, acts, processes, and/or methods disclosed herein. The circuitry 500 includes one or more processors 502 (sometimes referred to herein as "processors 502") operably coupled to one or more data storage devices (sometimes referred to herein as "storage 504"). The storage 504 includes machine executable code 506 stored thereon and the processors 502 include logic circuitry 508. The machine executable code 506 includes information describing functional elements that may be implemented by (e.g., performed by) the logic circuitry 508. The logic circuitry 508 is adapted to implement (e.g., perform) the functional elements described by the machine executable code 506. The circuitry 500, when executing the functional elements described by the machine executable code 506, should be considered as special purpose hardware configured for carrying out functional elements disclosed herein. In some embodiments the processors 502 may be configured to perform the functional elements described by the machine executable code 506 sequentially, concurrently (e.g., on one or more different hardware platforms), or in one or more parallel process streams.

When implemented by logic circuitry 508 of the processors 502, the machine executable code 506 is configured to adapt the processors 502 to perform operations of embodiments disclosed herein. For example, the machine executable code 506 may be configured to adapt the processors 502 to perform at least a portion or a totality of the method 300 of FIG. 3. As another example, the machine executable code 506 may be configured to adapt the processors 502 to perform at least a portion or a totality of the operations discussed for the control circuitry 122 of FIG. 1. As a specific, non-limiting example, the machine executable code 506 may be configured to adapt the processors 502 to generate the first pull-up signal 202, the first pull-down signal 204, the charge transfer control signal 206, the second pull-up signal 208, and the second pull-down signal 210 of FIG. 2 to control the apparatus 100 according to embodiments discussed herein.

The processors 502 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is configured to execute functional elements corresponding to the machine executable code 506 (e.g., software code, firmware code, hardware descriptions) related to embodiments of the present disclosure. It is noted that a general-purpose processor (may also be referred to herein as a host processor or simply a host) may be a microprocessor, but in the alternative, the processors 502 may include any conventional processor, controller, microcontroller, or state machine. The processors 502 may also be implemented as a combination of computing devices, such as a combination of a DSP and a microprocessor, a plurality of microprocessors, one or more microprocessors in conjunction with a DSP core, or any other such configuration.

In some embodiments the storage 504 includes volatile data storage (e.g., random-access memory (RAM)), non-volatile data storage (e.g., Flash memory, a hard disc drive, a solid state drive, erasable programmable read-only memory (EPROM), etc.). In some embodiments the processors 502 and the storage 504 may be implemented into a single device (e.g., a semiconductor device product, a system on chip (SOC), etc.). In some embodiments the processors 502 and the storage 504 may be implemented into separate devices.

In some embodiments the machine executable code 506 may include computer-readable instructions (e.g., software code, firmware code). By way of non-limiting example, the computer-readable instructions may be stored by the storage 504, accessed directly by the processors 502, and executed by the processors 502 using at least the logic circuitry 508. Also by way of non-limiting example, the computer-readable instructions may be stored on the storage 504, transferred to a memory device (not shown) for execution, and executed by the processors 502 using at least the logic circuitry 508. Accordingly, in some embodiments the logic circuitry 508 includes electrically configurable logic circuitry 508.

In some embodiments the machine executable code 506 may describe hardware (e.g., circuitry) to be implemented in the logic circuitry 508 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, Verilog™, SystemVerilog™ or very large scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuitry 508 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some embodiments the machine executable code 506 may include an HDL, an RTL, a GL description, a mask level description, other hardware description, or any combination thereof.

In embodiments where the machine executable code 506 includes a hardware description (at any level of abstraction), a system (not shown, but including the storage 504) may be configured to implement the hardware description described by the machine executable code 506. By way of non-limiting example, the processors 502 may include a programmable logic device (e.g., an FPGA or a PLC) and the logic circuitry 508 may be electrically controlled to implement circuitry corresponding to the hardware description into the logic circuitry 508. Also by way of non-limiting example, the logic circuitry 508 may include hard-wired logic manufactured by a manufacturing system (not shown, but including the storage 504) according to the hardware description of the machine executable code 506.

Regardless of whether the machine executable code 506 includes computer-readable instructions or a hardware description, the logic circuitry 508 is adapted to perform the functional elements described by the machine executable code 506 when implementing the functional elements of the machine executable code 506. It is noted that although a hardware description may not directly describe functional elements, a hardware description indirectly describes functional elements that the hardware elements described by the hardware description are capable of performing.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
   a pull-up sub-threshold current reduction circuit (SCRC) transistor including a pull-up gate terminal;
   a pull-down SCRC transistor including a pull-down gate terminal; and
   a charge transfer circuit electrically connected between the pull-up gate terminal and the pull-down gate terminal, the charge transfer circuit configured to transfer charge between the pull-up gate terminal and the pull-down gate terminal.

2. The apparatus of claim 1, wherein the charge transfer circuit includes a charge transfer gate, the charge transfer gate electrically controllable to selectively transfer the charge between the pull-up gate terminal and the pull-down gate terminal.

3. The apparatus of claim 2, wherein the charge transfer gate includes one or more metal oxide semiconductor field effect transistors (MOSFETs).

4. The apparatus of claim 2, wherein the charge transfer circuit further includes:
   a first output terminal electrically connected to the pull-up gate terminal;
   a second output terminal electrically connected to the pull-down gate terminal;
   a first resistor electrically connected between a first intermediate node and the first output terminal; and
   a second resistor electrically connected between a second intermediate node and the second output terminal.

5. The apparatus of claim 4, wherein the charge transfer circuit further includes:
   a first input terminal;
   a second input terminal;
   a third resistor electrically connected between the first input terminal and the first intermediate node; and
   a fourth resistor electrically connected between the second input terminal and the second intermediate node.

6. The apparatus of claim 5, wherein the charge transfer gate is electrically connected between the first intermediate node and the second intermediate node.

7. The apparatus of claim 5, wherein the charge transfer circuit further includes a third input terminal electrically connected to a gate terminal of the charge transfer gate.

8. The apparatus of claim 1, further comprising an SCRC pre-drive circuit electrically connected to a first input terminal and a second input terminal of the charge transfer circuit, the SCRC pre-drive circuit configured to provide a pull-up SCRC control signal to the first input terminal and a pull-down SCRC control signal to the second input terminal.

9. The apparatus of claim 8, further comprising control circuitry electrically connected to the SCRC pre-drive circuit and a third input terminal of the charge transfer circuit, the control circuitry configured to:
   provide a first pair of SCRC control signals to the SCRC pre-drive circuit;
   provide a second pair of SCRC control signals to the SCRC pre-drive circuit; and
   provide a charge transfer control signal to the third input terminal of the charge transfer circuit.

10. The apparatus of claim 9, wherein:
    the first pair of SCRC control signals includes a first pull-up signal and a first pull-down signal;
    the control circuitry is configured to stagger in time assertions and de-assertions of the first pull-up signal with assertions and de-assertions, respectively, of the first pull-down signal; and
    the control circuitry is configured to assert the charge transfer control signal between the staggered assertions and de-assertions of the first pull-up signal and the first pull-down signal.

11. The apparatus of claim 9, wherein:
    the second pair of SCRC control signals includes a second pull-up signal and a second pull-down signal;
    the control circuitry is configured to stagger in time assertions and de-assertions of the second pull-up signal with assertions and de-assertions, respectively, of the second pull-down signal; and
    the control circuitry is configured to assert the charge transfer control signal between the staggered assertions and de-assertions of the second pull-up signal and the second pull-down signal.

12. The apparatus of claim 9, wherein the SCRC pre-drive circuit includes:
    a first pull-up transistor and a first pull-down transistor configured to receive the first pair of SCRC control signals, the first pull-up transistor electrically connected in series with the first pull-down transistor; and
    a second pull-up transistor and a second pull-down transistor configured to receive the second pair of SCRC control signals, the second pull-up transistor electrically connected in series with the second pull-down transistor.

13. An apparatus, comprising:
a pull-up sub-threshold current reduction circuit (SCRC) transistor including a pull-up gate terminal;
a pull-down SCRC transistor including a pull-down gate terminal; and
a charge transfer circuit electrically connected between the pull-up gate terminal and the pull-down gate terminal, the charge transfer circuit configured to transfer charge between the pull-up gate terminal and the pull-down gate terminal, the charge transfer circuit including:
a first input terminal and a second input terminal;
a first output terminal and a second output terminal, the first output terminal electrically connected to the pull-up gate terminal of the pull-up SCRC transistor, the second output terminal electrically connected to the pull-down gate terminal of the pull-down SCRC transistor;
a first resistive path between the first input terminal and the first output terminal;
a second resistive path between the second input terminal and the second output terminal; and
a charge transfer gate electrically connected between the first resistive path and the second resistive path.

14. The apparatus of claim 13, wherein:
the first resistive path includes a first resistor electrically connected between a first intermediate node and the first output terminal;
the second resistive path includes a second resistor electrically connected between a second intermediate node and the second output terminal;
the first resistive path includes a third resistor electrically connected between the first input terminal and the first intermediate node; and
the second resistive path includes a fourth resistor electrically connected between the second input terminal and the second intermediate node.

15. The apparatus of claim 14, wherein the charge transfer gate is electrically connected between the first intermediate node and the second intermediate node.

16. The apparatus of claim 1, further comprising an SCRC pre-drive circuit and control circuitry, the control circuitry configured to:
operate the SCRC pre-drive circuit in an SCRC off operational state;
operate the SCRC pre-drive circuit in an SCRC on operational state;
maintain the SCRC pre-drive circuit deactivated during a charge transfer period of time at transitions between the SCRC off operational state and the SCRC on operational state; and
transfer the charge between the pull-up gate terminal and the pull-down gate terminal during the charge transfer period of time.

17. The apparatus of claim 16, wherein the control circuitry is configured to operate the SCRC pre-drive circuit in the SCRC off operational state by;
maintaining asserted a first pull-up signal on a gate terminal of a first pull-up transistor of the SCRC pre-drive circuit;
maintaining de-asserted a first pull-down signal on a gate terminal of a first pull-down transistor of the SCRC pre-drive circuit;
maintaining de-asserted a second pull-up signal on a gate terminal of a second pull-up transistor of the SCRC pre-drive circuit; and
maintaining asserted a second pull-down signal on a gate terminal of a second pull-down transistor of the SCRC pre-drive circuit.

18. The apparatus of claim 16, wherein the control circuitry is configured to operate the SCRC pre-drive circuit in the SCRC on operational state by:
maintaining de-asserted a first pull-up signal on a gate terminal of a first pull-up transistor of the SCRC pre-drive circuit;
maintaining asserted a first pull-down signal on a gate terminal of a first pull-down transistor of the SCRC pre-drive circuit;
maintaining asserted a second pull-up signal on a gate terminal of a second pull-up transistor of the SCRC pre-drive circuit; and
maintaining de-asserted a second pull-down signal on a gate terminal of a second pull-down transistor of the SCRC pre-drive circuit.

19. The apparatus of claim 16, wherein the control circuitry is configured to maintain the SCRC pre-drive circuit deactivated by:
maintaining de-asserted a first pull-up signal on a gate terminal of a first pull-up transistor of the SCRC pre-drive circuit;
maintaining de-asserted a first pull-down signal on a gate terminal of a first pull-down transistor of the SCRC pre-drive circuit;
maintaining de-asserted a second pull-up signal on a gate terminal of a second pull-up transistor of the SCRC pre-drive circuit; and
maintaining de-asserted a second pull-down signal on a gate terminal of a second pull-down transistor of the SCRC pre-drive circuit.

20. The apparatus of claim 16, wherein the control circuitry is configured to transfer the charge between the pull-up gate terminal and the pull-down gate terminal by asserting a charge transfer control signal on a gate terminal of a charge transfer gate.

* * * * *